United States Patent [19]
Simpson et al.

[11] Patent Number: 5,260,948
[45] Date of Patent: Nov. 9, 1993

[54] BIDIRECTIONAL BOUNDARY-SCAN CIRCUIT

[75] Inventors: David L. Simpson, West Columbia; Edward W. Hutton, Jr., Columbia, both of S.C.

[73] Assignee: NCR Corporation, Dayton, Ohio

[21] Appl. No.: 31,077

[22] Filed: Mar. 11, 1993

Related U.S. Application Data

[63] Continuation of Ser. No. 668,531, Mar. 13, 1991, abandoned.

[51] Int. Cl.⁵ .......................................... G01R 31/28
[52] U.S. Cl. .................................................. 371/22.3
[58] Field of Search ..................... 371/22.3; 324/158 R

[56] References Cited

U.S. PATENT DOCUMENTS

| | | | |
|---|---|---|---|
| 4,602,210 | 7/1986 | Fasang et al. | 371/22.3 |
| 4,703,484 | 10/1987 | Rolfe et al. | 371/22.3 |
| 4,740,970 | 4/1988 | Burrows et al. | 371/15 |
| 4,764,926 | 8/1988 | Knight et al. | 371/25 |
| 4,799,004 | 1/1989 | Mori | 324/73 R |
| 4,860,288 | 8/1989 | Teske et al. | 371/1 |
| 4,872,169 | 10/1989 | Whetsel, Jr. | 371/22.3 |
| 4,875,003 | 10/1989 | Burke | 324/73 |
| 4,905,241 | 2/1990 | Schmid et al. | 371/22.5 |
| 4,912,709 | 3/1990 | Teske et al. | 371/22.1 |
| 4,945,536 | 7/1990 | Hancu | 371/22.3 |
| 4,947,395 | 8/1990 | Bullinger et al. | 371/22.3 |
| 5,062,110 | 10/1991 | Kobayashi et al. | 371/22.3 |
| 5,084,874 | 1/1992 | Whetsel, Jr. | 371/22.3 |
| 5,115,191 | 5/1992 | Yoshimori | 324/158 R |

FOREIGN PATENT DOCUMENTS 0358376  3/1990  European Pat. Off. .

OTHER PUBLICATIONS

Gloster, et al., Boundary Scan with Built-In Self-Test, IEEE Design & Test of Computers, Feb. 1989, pp. 36-44.
C. W. Starke, An Efficient Self-Test Strategy for Testing VLSI-Chips, IEEE CH 2704-5/89/0000/5116/501.00, 1989, pp. 5-116 to 5-119.
IEEE Standard Test Access Port and Boundary-Scan Architecture, IEEE Computer Society, Test Technology Technical Committee, IEEE Standard 1149.1-1989/D3.

*Primary Examiner*—Charles E. Atkinson
*Attorney, Agent, or Firm*—Jack R. Penrod

[57] ABSTRACT

A boundary-scan circuit for a bidirectional pin of an integrated circuit which uses fewer standard cells if a cell design is considered, or fewer devices if non-standard cell integrated circuits are considered. In either case, the present invention provides the same functionality as provided in of the bidirectional boundary-scan circuits shown in IEEE 1149.1 in a circuit that should be more compact for the same logic family and integration technology.

19 Claims, 7 Drawing Sheets

BIDIRECTIONAL BOUNDARY-SCAN CIRCUIT

This is a continuation of application Ser. No. 07/668,531, filed Mar. 13, 1991, now abandoned.

BACKGROUND OF THE INVENTION

The present invention relates to a boundary-scan circuit, and more particularly to a boundary-scan register circuit that provides both an input and an output function to a bidirectional pin of an electronic device.

The semiconductor industry has adopted IEEE Std. 1149.1 (1990), which is hereby incorporated by reference, in order to provide a standard test architecture. The intent of this standard is to provide compatibility of test control and data signals between devices from different manufacturers in much the same way that logic compatibility within a logic family exists. The standard test architecture will allow the development of standard tests and standard test development techniques.

The standard architecture has provisions for numerous types of testing. Boundary-scan testing and built-in-self-test (BIST) testing are two of the commonly used provisions.

Figure 1:
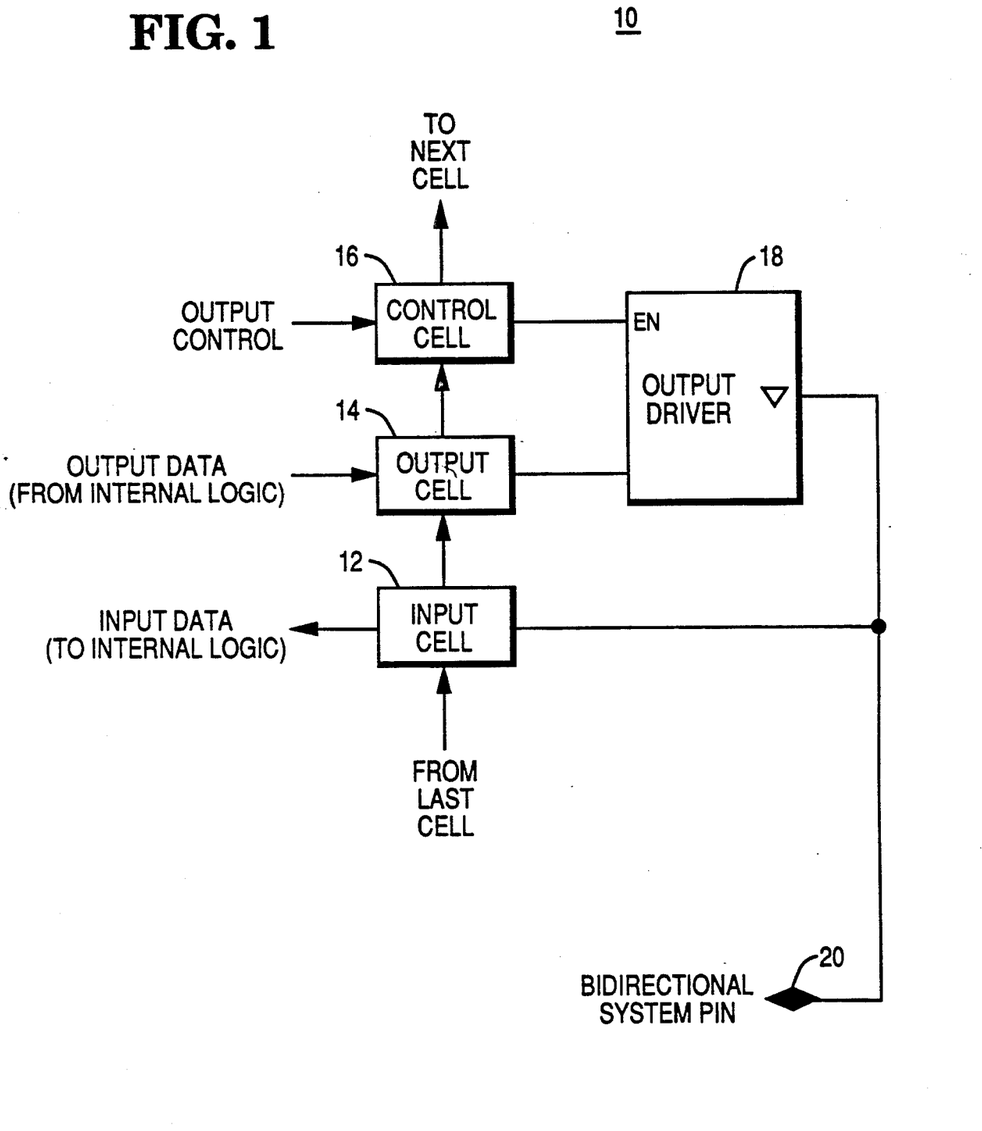
FIG. 1 is a generalized block diagram of a bidirectional boundary-scan circuit according to IEEE 1149.1.
Figure 2A:
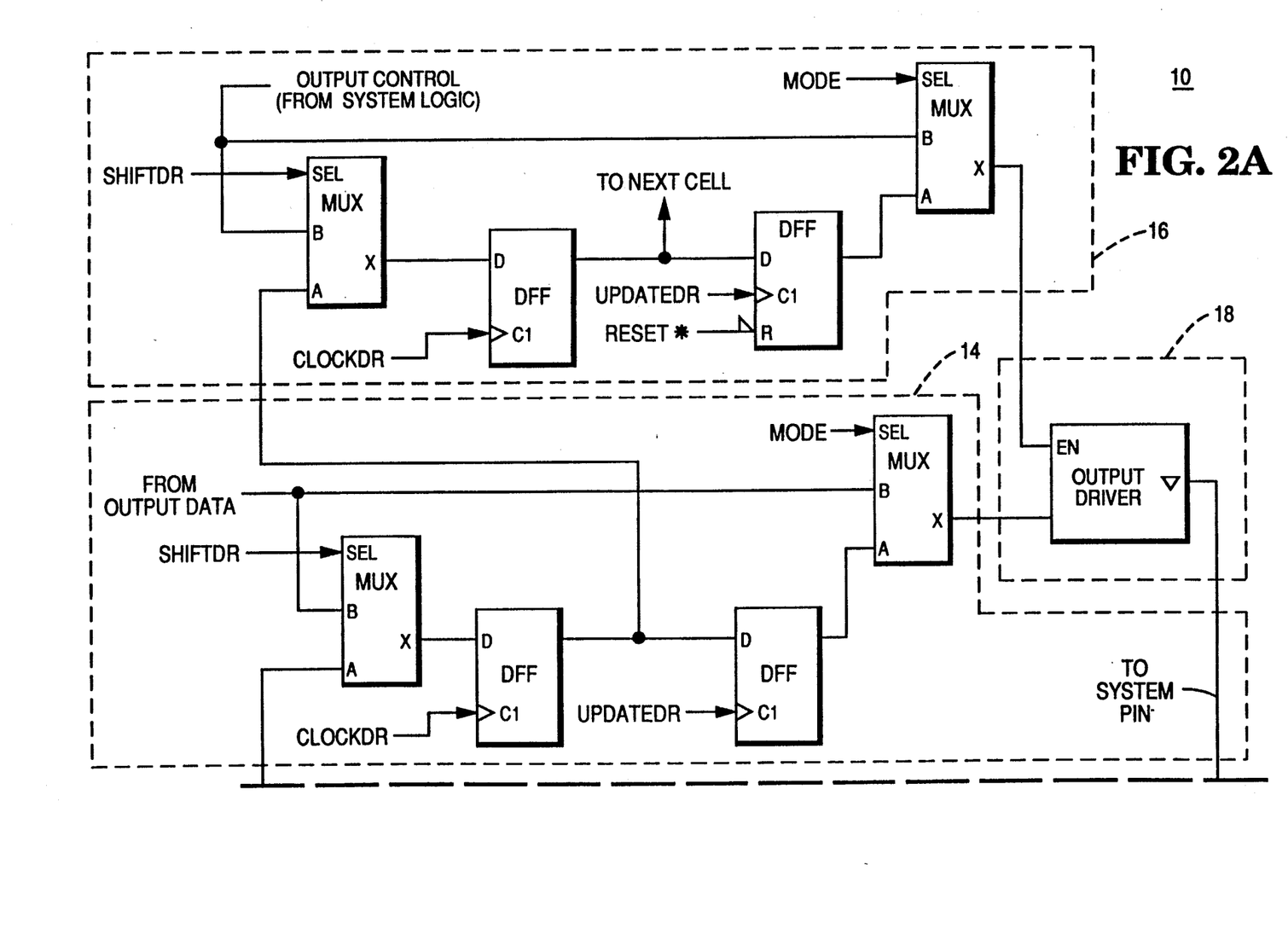
FIGS. 2A and 2B form a block diagram of one embodiment of the circuit in FIG. 1 by using cell circuits shown in IEEE 1149.1.
Figure 2B:
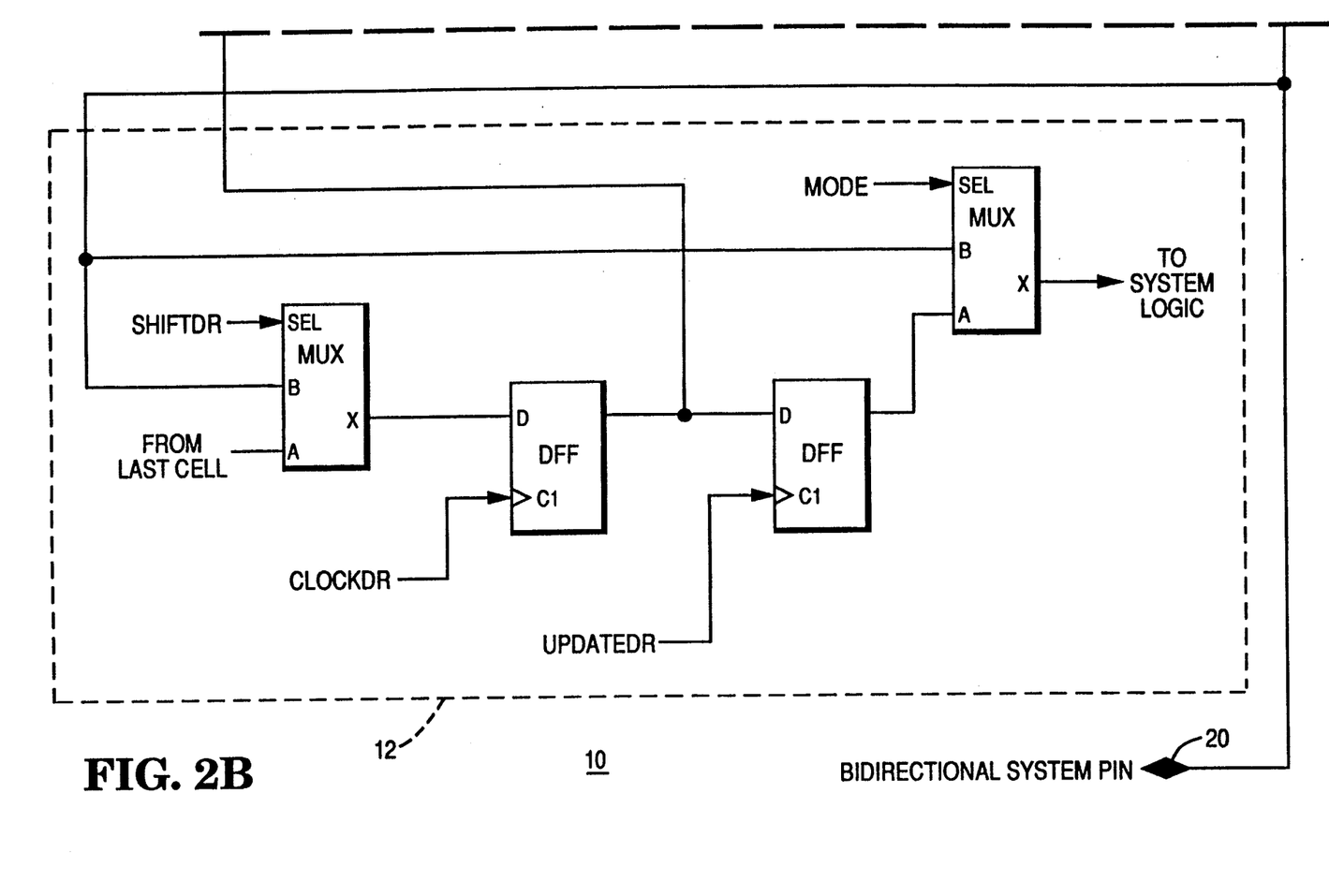
Figure 3A:
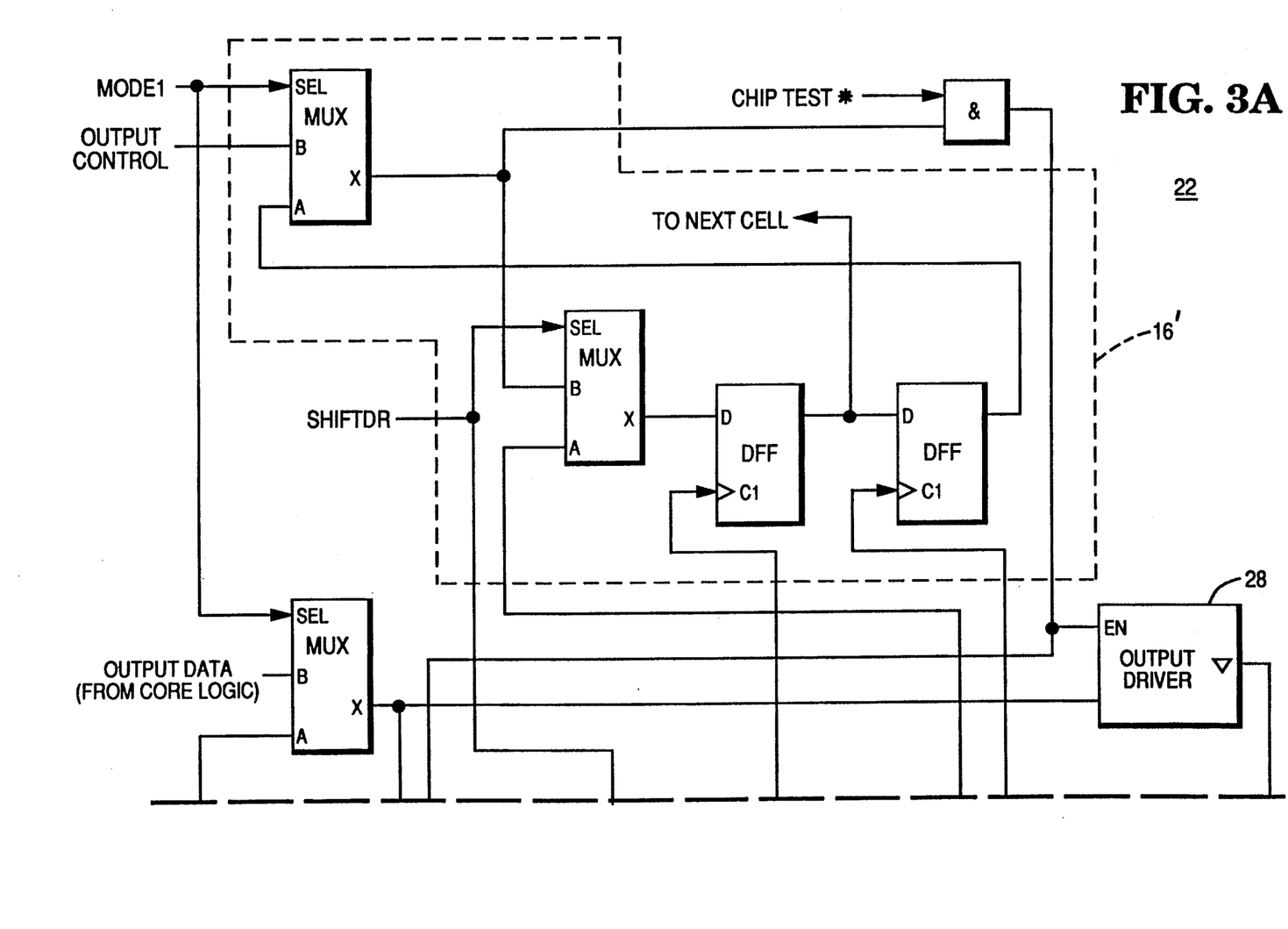
FIGS. 3A and 3B form when joined together another embodiment of a bidirectional boundary-scan circuit, which is also according to IEEE 1149.1.
Figure 3B:
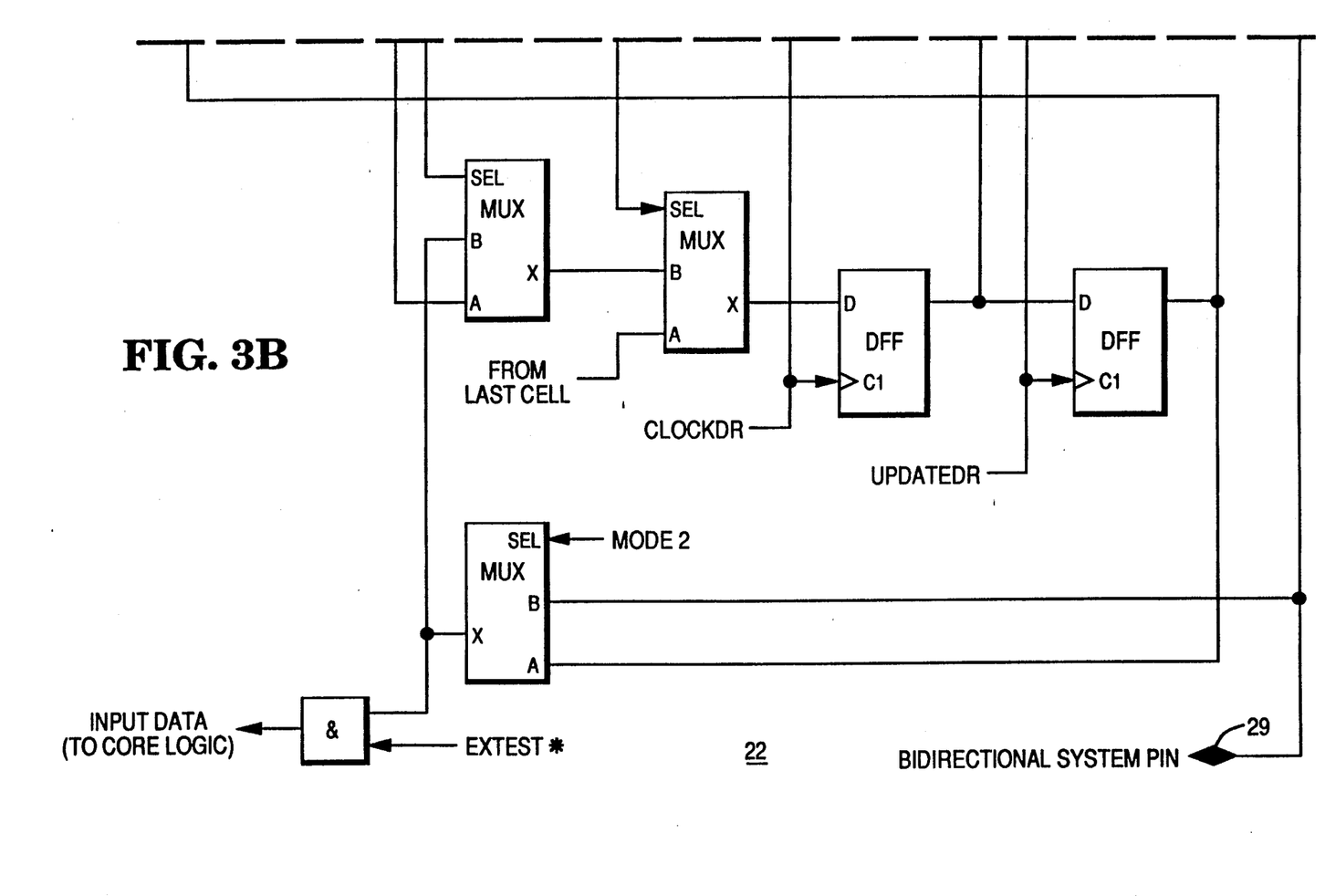

To provide boundary-scan testing, a boundary-scan circuit arrangement is included in an electronic device between the connection pins and the remainder of the unit that it is a part of. These connection pins, or simply pins, may connect to inputs, outputs or inputs/outputs of the electronic device, which means the boundary-scan circuits may be input, output or bidirectional in nature. Some implementations of input and of output boundary-scan circuits are shown in the standard. The input circuit and the output circuit each use approximately four sub-circuits to provide the functions necessary for the input or the output boundary-scan circuit. The standard also shows two implementations for bidirectional boundary-scan circuits. The first of the bidirectional circuits is shown in FIG. 1, which is a general description of a bidirectional boundary scan circuit. FIGS. 2A and 2B form one realization of FIG. 1 using the input boundary-scan circuit and the output boundary-scan circuit most often used in the standard. FIGS. 3A and 3B together show a second implementation of a bidirectional boundary-scan circuit.

The bidirectional boundary-scan circuit shown in FIGS. 2A and 2B has twelve sub-circuit functions: six type D flip-flops (DFF) and six two-to-one multiplexers (2-to-1 MUXs). The bidirectional boundary-scan circuit shown in FIGS. 3A and 3B likewise has twelve sub-circuit functions: four DFF, six 2-to-1 MUXs and two AND gates. Considering that bidirectional pins of an electronic device often come in multiples of eight, for example an input/output data bus connection, the amount of area taken up by bidirectional boundary-scan circuits can become substantial. This causes the designer of the electronic device to consider limiting the extent that boundary-scan is included on the electronic device because of the extra costs involved.

Thus, it is an object of the present invention to provide a bidirectional boundary scan circuit that requires fewer sub-circuit functions and less area of the semiconductor device per circuit.

It is another object of the present invention to provide a bidirectional boundary scan circuit that requires fewer sub-circuit functions and also provides a bidirectional BIST capability.

SUMMARY OF THE INVENTION

According to one aspect of the invention, the foregoing objects are achieved by providing a bidirectional boundary-scan circuit that connects to a bidirectional pin of a electronic device and includes a common register for both input and output boundary-scan testing.

According to another aspect of the invention, the foregoing objects of the invention are achieved by providing a bidirectional boundary-scan circuit that connects to a bidirectional pin of an integrated circuit and includes a first 2-to-1 MUX. The first 2-to-1 MUX has a first data input connected to said bidirectional pin, a second data input, a select input connected to an input/output switch control signal and an output. The first 2-to-1 MUX multiplexes said first data input to said output if selected and said second data input when selected by said input/output switch control signal. The output of said first 2-to-1 MUX is connected to an input to a logic circuit within the integrated circuit. A second 2-to-1 MUX has one of its data inputs connected to said first-2-to-1 MUX output, its other data input connected to an output of a logic circuit of said integrated circuit, a select input connected to a direction control signal (DIRI) and has an output. A third 2-to-1 MUX has one of its data inputs connected to said output of said second 2-to-1 MUX, its other data input connected to a previous boundary scan circuit, its select input connected to a shift control signal and has an output. A DFF has its data input connected to said output of said third 2-to-1 MUX, a clock input connected to a boundary-scan clock and has a non-inverting output. A register device for storing a data bit has a data input connected to said output of said DFF, a control input for sampling said register device data input as the data bit to be stored until the next sampling, and has a non-inverting output. A fourth 2-to-1 MUX has a first data input connected to a BIST signal of said integrated circuit, a second data input connected to said non-inverting output of said register means, a select input connected to a BIST-/Boundary-Scan select signal, and an output connected to said second data input of said first 2-to-1 MUX. In operation, with said first 2-to-1 MUX having selected its second input for multiplexing to its output, if said BIST-/Boundary-Scan select signal is in one logic state said BIST signal is multiplexed to its output and via said first 2-to-1 MUX to said internal logic to convey the BIST logic signal, and if said BIST/Boundary-Scan select signal is in another logic state said output of said register means is multiplexed to its output and via said first 2-to-1 MUX to said internal logic to convey the boundary-scan logic signal.

BRIEF DESCRIPTION OF THE DRAWINGS

While the specification concludes with the appended claims particularly pointing out and distinctly claiming the subject matter which is regarded as the invention, it is believed that the invention will be better understood from the following detailed description of the illustrative embodiment taken in conjunction with the accompanying drawings in which:

DETAILED DESCRIPTION OF A PREFERRED EMBODIMENT

Referring to FIG. 1, there is shown a high level block diagram of a bidirectional boundary-scan circuit 10. FIG. 1 corresponds to FIG. 10-21, Example 1, of IEEE 1149.1. The bidirectional boundary-scan circuit 10 is a combination of an input cell 12 and an output cell 14 to provide the bidirectional capability. Further, a control cell 16 and a tristate output driver 18 control the circuit 10 to operate in normal input mode, normal output mode, boundary-scan input mode or boundary-scan output mode to a bidirectional system pin 20.

FIGS. 2A and 2B form a more detailed block diagram of the bidirectional boundary-scan circuit 10. FIGS. 2A and 2B show the bidirectional boundary-scan circuit 10 with specific known cells substituted for the three cells referenced in FIG. 1. The input cell 12 and the output cell 14 are the same as the cell shown in FIG. 10-12 of IEEE 1149.1 which is suggested for either input or output use. The control cell 16 shown in FIG. 10-21 of IEEE 1149.1 is explicitly recommended for use as the control cell. The control cell 16 and the output driver 18 are standard features. The control cell 16, as shown by dashed lines in FIG. 2A consists of two 2-to-1 MUXs and two DFFs. The bidirectional portion of the circuit 10, i.e. the input and output circuits shown in FIGS. 2A and 2B considt of four 2-to-1 MUX cells and four memory cells, in this case DFF cells in order to provide boundary-scan capability for one bidirectional pin. Since bidirectional pins often occur in multiples of eight, for example to connect an integrated circuit chip to a bidirectional system bus, a reduction of even one cell result in a substantial savings of semiconductor area required for the overall boundary-scan capability.

Referring now to FIGS. 3A and 3B, which together form a block diagram of a second bidirectional boundary-scan circuit 22. The bidirectional boundary-scan circuit 22 is shown in FIG. 10-22 Example 2 of IEEE 1149.1. The cell complement of this known circuit 22 is slightly different than that of the bidirectional circuit 10 shown in FIGS. 2A and 2B. The bidirectional circuit 22 has six 2-to-1 MUX cells, two AND cells and four memory cells, in this case DFFs. Two of the 2-to-1 MUXs and two of the DFFs comprise the output control circuit 16'. So, besides the output driver 28, the remainder of the bidirectional circuit 22 consists eight cells to multiplex or switch data to or from the bidirectional pin 29.

Figure 4:
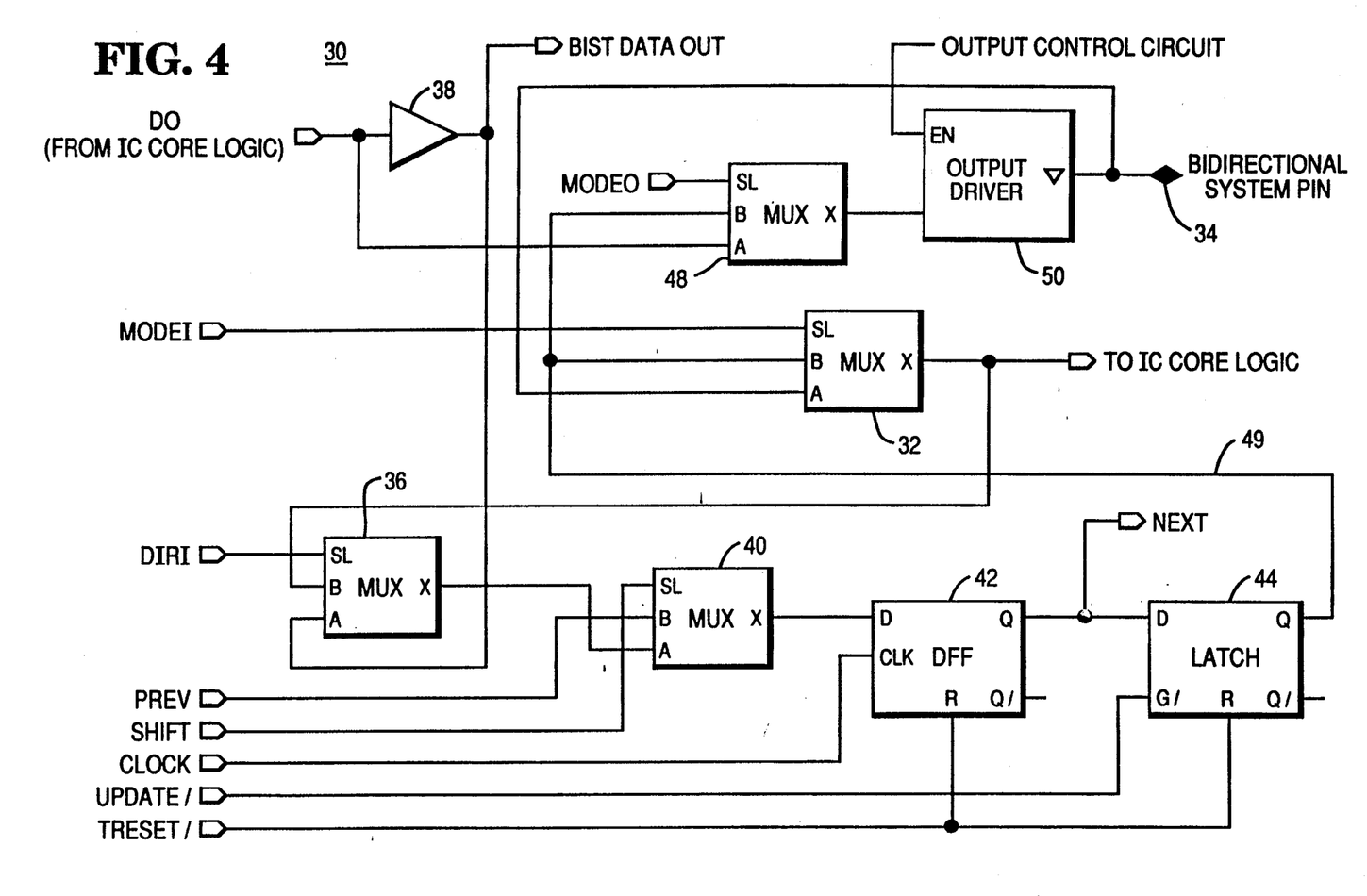
FIG. 4 is a block diagram of a bidirectional boundary-scan circuit according to the present invention.

Referring now to FIG. 4, a block diagram of a bidirectional boundary-scan circuit 30 is shown. The bidirectional boundary-scan circuit 30 has a 2-to-1 MUX 32 that has one of its two data inputs connected to a bidirectional system pin 34. The second data input of 2-to-1 MUX 32 is connected to an output of a latch 44, which will be described in greater detail below. The 2-to-1 MUX 32 also has a select input that is connected to a control signal MODEI that if asserted, i.e. set to logic high, causes the 2-to-1 MUX 32 to multiplex the first data input to a data output thereof. Conversely, if the MODEI control signal is not asserted, i.e. reset to logic low, the 2-to-1 MUX 32 multiplexes the signal received from the latch 44 via its second data input to its output. The data output of 2-to-1 MUX 32 is connected to an input of core logic within the integrated circuit associated with the bidirectional boundary-scan circuit 30.

The output of 2-to-1 MUX 32 is further connected to one data input of another 2-to-1 MUX 36. A second data input of the 2-to-1 MUX 36 is connected to an output D0 from the core logic of the integrated circuit via a non-inverting buffer 38. The non-inverting buffer 38 is primarily to ensure sufficient drive capabilities and may be omitted if there is sufficient drive available. The 2-to-1 MUX cell 36 has a select input connected to a direction input (DIRI) control signal from test/operate enable control circuits (not shown) within the integrated circuit.

In operation, the 2-to-1 MUX 36 will multiplex either the signal from output of 2-to-1 MUX 32, which typically is the input signal on the bidirectional pin 34, or the signal at the output of non-inverting buffer 38, which typically is the output of the core logic (not shown) to a test input (not shown, but maybe be a BIST input signal or a boundary-scan input signal) from their respective data inputs of the 2-to-1 MUX 36 to the output thereof.

The output of the 2-to-1 MUX cell 36 is connected to one data input of a further 2-to-1 MUX cell 40. A second data input of the 2-to-1 MUX cell 40 is connected to a previous boundary-scan register cell output to form a larger serial IEEE 1149.1 boundary-scan circuit (not shown). A select input of the 2-to-1 MUX cell 40 is connected to a shift control signal which controls the multiplexing of either logic signals from the output of the previous 2-to-1 MUX cell 36 or from the previous boundary-scan register cell (not shown) to an output of 2-to-1 MUX cell 40.

The output of the 2-to-1 MUX cell 40 is connected to a data (D) input of a DFF 42. A clock input of the DFF 42 is connected to clock signals (not shown) that shift data in from the 2-to-1 MUX cell 40. The clock signal is coordinated with the state of the shift control signal to either shift test data into or out of the core logic circuits, or to shift boundary-scan data along a serial chain of registers in a manner well known from IEEE 1149.1.

The DFF 42 has a non-inverting output that is connected to a next boundary-scan register (not shown) to form part of the serial IEEE 1149.1 boundary-scan circuit mentioned previously. The non-inverted output of DFF 42 also is connected to a latch 44 such a type LATRP shown in *NCR ASIC Data Book* 1989 by NCR Corporation, Dayton, Ohio. The IEEE 1149.1 standard suggests the use of some type of one bit register or memory after the boundary-scan register, e.g. DFF 42, to stabilize and control the data and suggests the use of a latch or a DFF as this one bit register or memory device. The circuit 30 shows a latch 44 at this location, but the slightly larger DFF cell could be used instead.

The DFF 42 and the latch 44 each has a test reset input. These two reset inputs are connected to a test reset signal TRESET/ that is essentially the same as the boundary-scan reset signal described in IEEE 1149.1. Similarly, the gating input of the latch 44 is connected to a gating control signal that essentially the same as the update signal described in IEEE 1149.1.

The non-inverted output of the latch 44 is connected via line 49 to the previously mentioned second data input of the 2-to-1 MUX 32. The output of the latch 44, when active, typically carries some type of test signal. Thus, line 49 connects test signals to the second data input of the 2-to-1 MUX 32. If MODEI controls the 2-to-1 MUX 32 to select the second data input, the output of the latch 44 is connected to an input of the core logic of the integrated circuit via line 49 and 2-to-1. MUX 32 as part of some type of test procedure. The gate input and the reset input of the latch 44 provide numerous predetermined ways of manipulating test data into the core logic.

The non-inverted output of the latch 44 is also connected to a data input of another 2-to-1 MUX cell 48. A second data input of the 2-to-1 MUX cell 48 is connected to the output D0 from the core logic of the integrated circuit either directly, or via a non-inverting buffer 38 (this alternate connection is not shown) if a higher drive is necessary. A select input of the 2-to-1 MUX cell 48 is connected to a control signal MODEO which if asserted, which in this case means a logic 1, causes the 2-to-1 MUX 48 to multiplex a data signal from the data input connected to the output of the latch 44 to a data output of the 2-to-1 MUX 48. Conversely, if the MODEO control signal is not asserted, which in this case means a logic 0, the 2-to-1 MUX 48 multiplexes an output signal DO from the input connected thereto to the output of the 2-to-1 MUX 48, which often is the same as the output to the bidirectional system pin 50 as explained below.

The 2-to-one MUX 48 either multiplexes a signal from D0, i.e. a core logic output, to the output of the 2-to-1 MUX 48, which is the data path for normal operations, or multiplexes a signal from the output of latch 44 to to the output of 2-to-1 MUX 48, which is usually the data path for various test operations.

The output of the 2-to-1 MUX 48 is connected to an output driver 50 and an output of the output driver 50 is connected to the bidirectional pin 34. The output driver 50 has an enable control input that is connected to an output control circuit (not shown), such as the control cell 16 shown in FIG. 2A, and is controlled by a signal therefrom. This control signal disables the output driver 50 when an output to the bidirectional pin 34 is not desired, for example during an input operation, and enables the output of the output driver 50 to drive the bidirectional pin 34 with the signal it receives from the 2-to-1 MUX 48 when an output is desired. Output drivers, such as the output driver 50, and the control of output drivers are well known in the art.

The bidirectional boundary-scan circuit 30 has one switch 32, three -2-to-1 MUXs 36, 40, 48, one buffer 38, one DFF 42 and one latch 44 for a total of seven cells in addition to the output driver 50 which is present in most bidirectional pin circuits. These seven cells form a more compact bidirectional boundary-scan circuit than the eight cells required by the bidirectional boundary-scan circuits shown in FIGS. 2A and 2B or FIGS. 3A and 3B. Cells are saved by switching both input or output test signals through the same register cells DFF 42 and latch 44 for input boundary-scan and output boundary-scan procedures.

Figure 5:
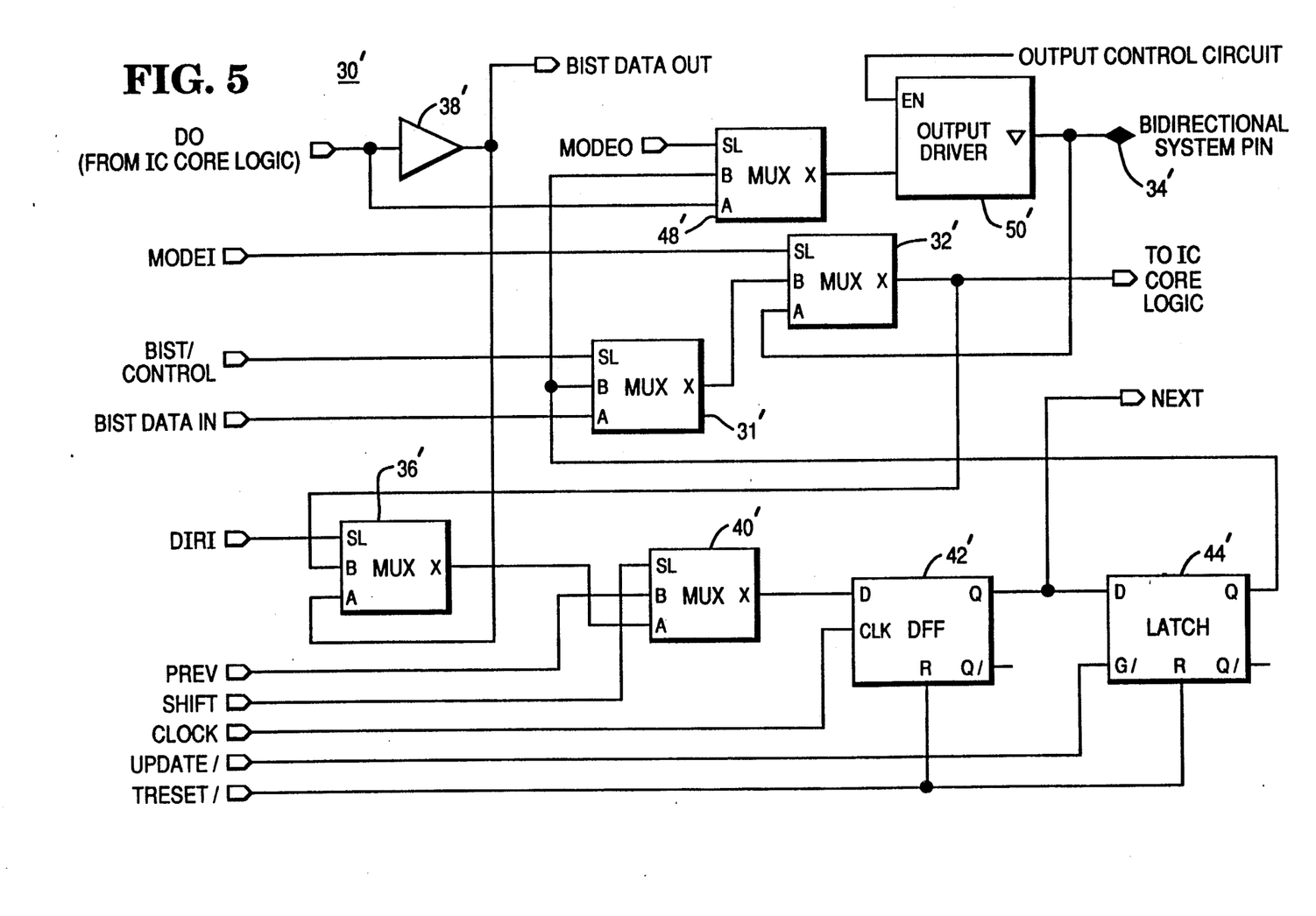
FIG. 5 is a block diagram of the bidirectional boundary-scan circuit shown in FIG. 4 which also allows the use of BIST testing signals.

Referring now to FIG. 5, another embodiment of a bidirectional boundary-scan circuit 30' according to the present invention is illustrated in block diagram form. The bidirectional boundary-scan circuit 30' is substantially the same as the bidirectional boundary-scan circuit 30 shown in FIG. 4 with a few differences.

The bidirectional boundary-scan circuit 30' has a 2-to-1 MUX 31' that has one data input connected to a BIST signal from core logic (not shown) within the integrated circuit that the circuit 30' is a part of. A second data input of the 2-to-1 MUX 31' is connected to an output of a latch 44' which is essentially the same as the latch 44 shown in FIG. 4. An output of the 2-to-1 MUX 31' is connected to one input of a 2-to-1 MUX 32'. The other input of the 2-to-1 MUX 32' is connected to a bidirectional system pin 34' essentially as the first data input of 2-to-1 MUX 32 is connected to its bidirectional system data pin 34 as shown in FIG. 4.

The 2-to-1 MUX 31' has a select input that connects to an active low control signal BIST/ from control circuits within the integrated circuit (not shown). If BIST/ is active low, the 2-to-1 MUX 31' multiplexes the BIST data from core logic through the input attached thereto to the output of 2-to-1 MUX 31'. Conversely, if BIST/ is not active low, the 2-to-1 MUX 31' multiplexes the signal from the output of latch 44', which is typically a boundary-scan test signal of some type. Thus, the addition of the 2-to-1 MUX 31' to the circuit otherwise shown in FIG. 4 adds the ability to use the bidirectional boundary-scan circuit also for providing BIST test signals to and from the core logic within the integrated circuit. All of this functionality in the relatively small circuit 30' that has five 2-to-1 MUX cells, a DFF cell, a latch cell, and a buffer cell in addition to the output driver cell.

Thus, it will now be understood that there has been disclosed a bidirectional boundary-scan circuit which provides full bidirectional boundary-scan functionality in seven simple logic cells in addition to an output control circuit and an output driver. Further, there has been disclosed a bidirectional boundary-scan circuit which provides full bidirectional boundary-scan functionality and BIST functionality in eight simple logic cells in addition to an output control circuit and an output driver. This is a substantial improvement over the boundary-scan circuits suggested by IEEE 1149.1. While the invention has been particularly illustrated and described with reference to a preferred embodiment thereof, it will be understood by those skilled in the art that various changes in form, details, and applications may be made therein. It is accordingly intended that the appended claims shall cover all such changes in form, details and applications which do not depart from the true spirit and scope of the invention.

What is claimed as new and desired to be secured by Letters Patent of the United States is:

1. A bidirectional boundary-scan circuit connected to a bidirectional pin of an electronic device, comprising:
 a first 2-to-1 MUX having a first data input connected to said bidirectional pin, a second data input, a select input connected to an input/output control signal and an output, said first 2-to-1 MUX switches said first input to said output if enabled to receive an input by said input/output control signal and switches said second input to said output if not enabled by said input/output control signal;
 said output of said first 2-to-1 MUX is connected to an input to a logic circuit within said electronic device;
 a second 2-to-1 MUX having one of its data inputs connected to said switch means output, its other data input connected to an output of a logic circuit of said electronic device, a select input connected to a direction control signal, and has an output;
 a third 2-to-1 MUX having one of its data inputs connected to said output of said second 2-to-1

MUX, its other data input connected to a previous boundary scan circuit, its select input connected to a shift control signal and has an output;

a DFF having its data input connected to said output of said third 2-to-1 MUX, a clock input connected to a boundary-scan clock and a non-inverting output;

register means for storing a data bit having a data input connected to said output of said DFF, a control input for sampling said register means data input as the data bit to be stored until the next sampling, and a non-inverting output;

a fourth 2-to-1 MUX having an input connected to said non-inverting output of said register means, a second input connected to an output of the internal logic of said electronic device, a select input connected to a second input/output control signal and an output; and an output driver having an input connected to said output of said fourth 2-to-1 MUX, an output connected to said bidirectional pin and an enable control input that enables or disables said output driver from driving said bidirectional pin with a signal outputted from said fourth 2-to-1 MUX on said output thereof;

whereby said control signals connect the DFF as a register to store input data during input tests and output data during output tests, thereby using the DFF for both purposes and obviating the need for another DFF register.

2. The circuit according to claim 1, wherein said non-inverting output of said DFF is also connected to a previous input of an upstream boundary-scan circuit.

3. The circuit according to claim 1, wherein said register means is another DFF.

4. The circuit according to claim 1, wherein said register means is a latch.

5. A bidirectional boundary-scan circuit connected to a bidirectional pin of an integrated circuit, comprising:

a first 2-to-1 MUX having a first input connected to said bidirectional pin, a second input connected to an input/output switch control signal and an output, said switch means switches said first input to said output if enabled to recieve an input by said input/output switch control signal and switches a logic low to said output if not enabled to receive an input by said input/output switch control signal;

said output of said 2-to-1 MUX is connected to an input to a logic circuit within said electronic device;

a second 2-to-1 MUX having one of its data inputs connected to said switch means output, its other data input connected to an output of a logic circuit of said integrated circuit, a select input connected to a directional control signal and has an output;

a third 2-to-1 MUX having one of its data inputs connected to said output of said second 2-to-1 MUX, its other data input connected to a previous boundary scan circuit, its select input connected to a shift control signal and has an output;

a DFF having its data input connected to said output of said third 2-to-1 MUX, a clock input connected to a boundary-scan clock and a non-inverting output;

register means for storing for storing a data bit having a data input connected to said output of said DFF, a control input for sampling said register means data input as the data bit to be stored until the next sampling, and a non-inverting output;

a fourth 2to-1 MUX having an input connected to said output of said register means, a second input connected to an output of internal logic of the integrated circuit, a select input connected to a second input/output switch control signal and an output; and an output driver having an input connected to said output of said fourth 2-to-1 MUX and an enable input connected to an input/output enable signal and an output that is connected to said bidirectional pin;

whereby said input/output enable signal logically connects the output of said fourth 2-to-1 MUX to said bidirectional pin if enabled and logically disconnects the output of said third multiplexer from said bidirectional pin if disabled.

6. The circuit according to claim 5, wherein said non-inverting output of said DFF is also connected to a previous input of an upstream boundary-scan circuit.

7. The circuit according to claim 5, wherein said register means is another DFF.

8. The circuit according to claim 5, wherein said register means is a latch.

9. A bidirectional boundary-scan circuit connected to a bidirectional pin of an integrated circuit, comprising:

a first 2-to-1 MUX having a first data input connected to said bidirectional pin, a second data input, a select input connected to an input/output switch control signal and an output, said first 2-to-1 MUX multiplexes said first data input to said output if selected and said second data input when selected by said input/output switch control signal;

said output of said first 2-to-1 MUX is connected to an input to a logic circuit within said electronic device;

a second 2-to-1 MUX having one of its data inputs connected to said first-2-to-1 MUX output, its other data input connected to an output of a logic circuit of said integrated circuit, a select input connected to (a direction control signal and has an output;

a third 2-to-1 MUX having one of its inputs connected to said output of said second 2-to-1 MUX, its other data input connected to a previous boundary scan circuit, its select input connected to a shift control signal and has an output;

a DFF having its data input connected to said output of said third 2-to-1 MUX, a clock input connected to a boundary-scan clock and a non-inverting output;

register means for storing for storing a data bit having a data input connected to said output of said DFF, a control input for sampling said register means data input as the data bit to be stored until the next sampling, and a non-inverting output;

a fourth 2-to-1 MUX having a first data input connected to a BIST signal of said integrated circuit, a second data input connected to said non-inverting output of said register means; a select input connected to a BIST/Boundary-Scan select signal, and an output connected to said second data input of said first 2-to-1 MUX means;

whereby if said first 2-to-1 MUX has selected its second input for multiplexing to its output, if said BIST/Boundary-Scan select signal is in one logic state said BIST signal is multiplexed to its output and via said first 2-to-1 MUX to said internal logic, and if said BIST/Boundary-Scan select signal is in another logic state said output of said register means is multiplexed to its output and via said first 2-to-1 MUX to said internal logic to convey a boundary-scan logic signal.

10. A bidirectional boundary-scan circuit connected to a bidirectional pin of an integrated circuit according to claim 11, further comprising:
a fifth 2-to-1 MUX having an input connected to said output of said register means, a second input connected to an output of internal logic of the integrated circuit, a select input connected to a second input/output switch control signal and an output; and
an output driver having an input connected to said output of said fifth 2-to-1 MUX and an enable input connected to an input/output enable signal and an output that is connected to said bidirectional pin;
whereby said input/output enable signal logically connects the output of said fifth two-to-one multiplexer to said bidirectional pin if enabled and logically disconnects the output of said fifth 2-to-1 MUX from said bidirectional pin if disabled.

11. The circuit according to claim 10, wherein said non-inverting output of said DFF is also connected to a previous input of an upstream boundary-scan circuit.

12. The circuit according to claim 10, wherein said register means is another DFF.

13. The circuit according to claim 10, wherein said register means is a latch.

14. A bidirectional boundary-scan circuit connected to a bidirectional pin of an electronic device, comprising:
a first MUX having a first data input connected to said bidirectional pin, a second data input, a select input connected to an input/output control signal and an output, said first MUX switches said first input to said output if enabled to receive an input by said input/output control signal and switches said second input to said output if not enabled by said input/output control signal;
said output of said first MUX is connected to an input to a logic circuit within said electronic device;

a second MUX having one of its data inputs connected to said switch means output, its other data input connected to an output of a logic circuit of said electronic device, a select input connected to a direction control signal, and has an output;
a third MUX having one of its data inputs connected to said output of said second MUX, another data input connected to a previous boundary scan circuit, its select input connected to a shift control signal and has an output;
a flip-flop having a data input connected to said output of said third MUX, a clock input connected to a boundary-scan clock and a non-inverting output;
storage means for storing a data bit having a data input connected to said output of said flip-flop, a control input for sampling said storage means data input as the data bit to be stored until the next sampling, and a non-inverting output;
a fourth MUX having an input connected to said non-inverting output of said storage means, a second input connected to an output of the internal logic of said electronic device, a select input connected to a second input/output control signal and an output; and
an output driver having an input connected to said output of said fourth MUX, an output connected to said bidirectional pin and an enable control input that enables or disables said output driver from driving said bidirectional pin with a signal outputted from said fourth MUX on said output thereof;
wherein said control signals connect said flip flop as a register to store input data during input tests and output data during output tests.

15. The circuit according to claim 14, wherein said flip-flop is a type D flip-flop (DFF).

16. The circuit according to claim 15, wherein said non-inverting output of said DFF is also connected to a previous input of an upstream boundary-scan circuit.

17. The circuit according to claim 15, wherein said storage means is another DFF.

18. The circuit according to claim 15, wherein said storage means is a latch.

19. The circuit according to claim 14, wherein said storage means is a latch.

* * * * *

UNITED STATES PATENT AND TRADEMARK OFFICE
CERTIFICATE OF CORRECTION

PATENT NO. : 5,260,948

DATED : November 9, 1993

INVENTOR(S) : David L. Simpson, et al.

It is certified that error appears in the above-identified patent and that said Letters Patent is hereby corrected as shown below:

Column 8, line 44, after the word "its", add "data".

Signed and Sealed this

Twenty-first Day of June, 1994

Attest:

BRUCE LEHMAN

*Attesting Officer*  *Commissioner of Patents and Trademarks*